United States Patent [19]
Tran

[11] Patent Number: 5,444,722
[45] Date of Patent: Aug. 22, 1995

[54] MEMORY MODULE WITH ADDRESS ERROR DETECTION

[75] Inventor: Dan T. Tran, Laguna Niguel, Calif.

[73] Assignee: Unisys Corporation, Blue Bell, Pa.

[21] Appl. No.: 18,949

[22] Filed: Feb. 17, 1993

[51] Int. Cl.⁶ .......................................... H04Q 11/04
[52] U.S. Cl. ................................ 395/183.18; 371/62; 364/270; 364/DIG. 1; 395/405; 395/495; 395/299
[58] Field of Search ...................... 371/60, 68.1, 69.1, 371/72, 10.1, 20.1, 21.1, 48, 2.2, 29.5, 61, 62; 395/575, 275, 325, 425; 364/270, 271.5, 285.3

[56] References Cited

U.S. PATENT DOCUMENTS

| | | | |
|---|---|---|---|
| 3,982,111 | 9/1976 | Lerner et al. | 371/60 |
| 4,130,240 | 12/1978 | Millham et al. | 371/60 |
| 4,359,771 | 11/1982 | Johnson et al. | 371/13 |
| 4,672,609 | 6/1987 | Humphrey et al. | 371/21.1 |
| 4,688,222 | 8/1987 | Blum | 371/25.1 |

*Primary Examiner*—Robert W. Beausoliel, Jr.
*Assistant Examiner*—Dieu-Minh Le
*Attorney, Agent, or Firm*—Charles J. Fassbender; Mark T. Starr; Robert R. Axenfeld

[57] ABSTRACT

A memory module is used in multiples on a bus in a data processing system. Each memory module comprises a plurality of storage cells, an input circuit for receiving a read command and a read address from the bus, and a compare circuit which generates a match signal when the read address is within a selectable address range for the storage cells. Also, the module further includes: a control circuit, coupled to the compare circuit, which responds to the match signal by almost always executing the read command in a small time interval on the bus and occasionally executing the read command in a long time interval. Further, the module includes a bus transmit circuit, coupled to the control circuit, for sending a control signal on the bus if the control circuit selects the long time interval. Also, the module includes an error circuit, coupled to the control circuit and the bus, for setting an error flag if the control circuit selects the short time interval and, during that short time interval, the control signal is detected on the bus from another module in the memory system.

12 Claims, 3 Drawing Sheets

MEMORY MODULE WITH ADDRESS ERROR DETECTION

BACKGROUND OF THE INVENTION

This invention relates to data processing systems of the type which include a digital computer and a plurality of memory modules which are intercoupled to each other by a system bus; and more particularly, it relates to the detection of certain memory addressing errors which can occur in such systems.

In a data processing system of the above type, each memory module includes an array of storage cells which are selectively addressed by the digital computer. Thus, each memory module includes some logic circuitry which determines whether or not a particular address from the computer is for that module. For example, the first memory module might respond to addresses of the range 0 thru $2^{16}$-1; the second memory module might respond to addresses $2^{16}$ thru $2(2^{16})$-1; the third memory module might respond to addresses $2(2^{16})$ thru $3(2^{16})$-1; etc.

In order for each memory module to respond to a certain range of addresses, each module must include some means for selectively assigning a particular range of addresses to that module. For example, the address range for a memory module can be held in a register on the module, or it can be indicated by the setting of several electro-mechanical switches on the module.

Now, a problem which the above described system is susceptible to is the possibility that through an error, two memory modules will be assigned the same address range. When that happens, the data processing system will still operate but at a reduced capacity.

Suppose for example, that the first and second memory modules are assigned the same address range. In that case, the first and second memory modules will perform their Read operations and Write operations on their data storage cells in parallel with each other; and, no memory error will be detected.

Consequently, the two memory modules can continue to operate in parallel for an indefinite period of time. In fact, if the reduced memory capacity of the data processing system is sufficient to run all of the computer's programs, then the error would stay undetected.

Accordingly, the primary object of the invention is to provide a novel memory module by which the above problem is overcome.

BRIEF SUMMARY OF THE INVENTION

One preferred embodiment of the present invention comprises a memory module for use in multiples on a bus as a multi-module memory system. This memory module includes a plurality of storage cells, an input circuit for receiving a read command and a read address from the bus, and a compare circuit which generates a match signal when the read address is within a selectable address range for the storage cells. Further, in accordance with the present invention, the memory module also includes the following:

1) a control circuit, coupled to the compare circuit, which responds to the match signal by almost always executing the read command in a relatively small time interval on the bus but occasionally and at random executing the read command in a long time interval;

2) a bus transmit circuit, coupled to the control circuit, for sending a control signal on the bus if the control circuit selects the long time interval; and, 3) an error circuit, coupled to the control circuit and the bus, for setting an error flag if the control circuit selects the short time interval and, during that short time interval, the control signal occurs on the bus from another module in the memory system.

When several of the above memory modules are used in a multi-module memory system, each module selects the long time interval at random with respect to the other modules. Thus, if through an error, two modules A and B are assigned the same address range, that event will be detected by the error circuit in module A when module A selects the short time interval and module B selects the long time interval.

BRIEF DESCRIPTION OF THE DRAWINGS

A preferred embodiment of the invention, as well as its features and advantages, are described herein in conjunction with the accompanying drawings wherein.

DETAILED DESCRIPTION

Figure 1:
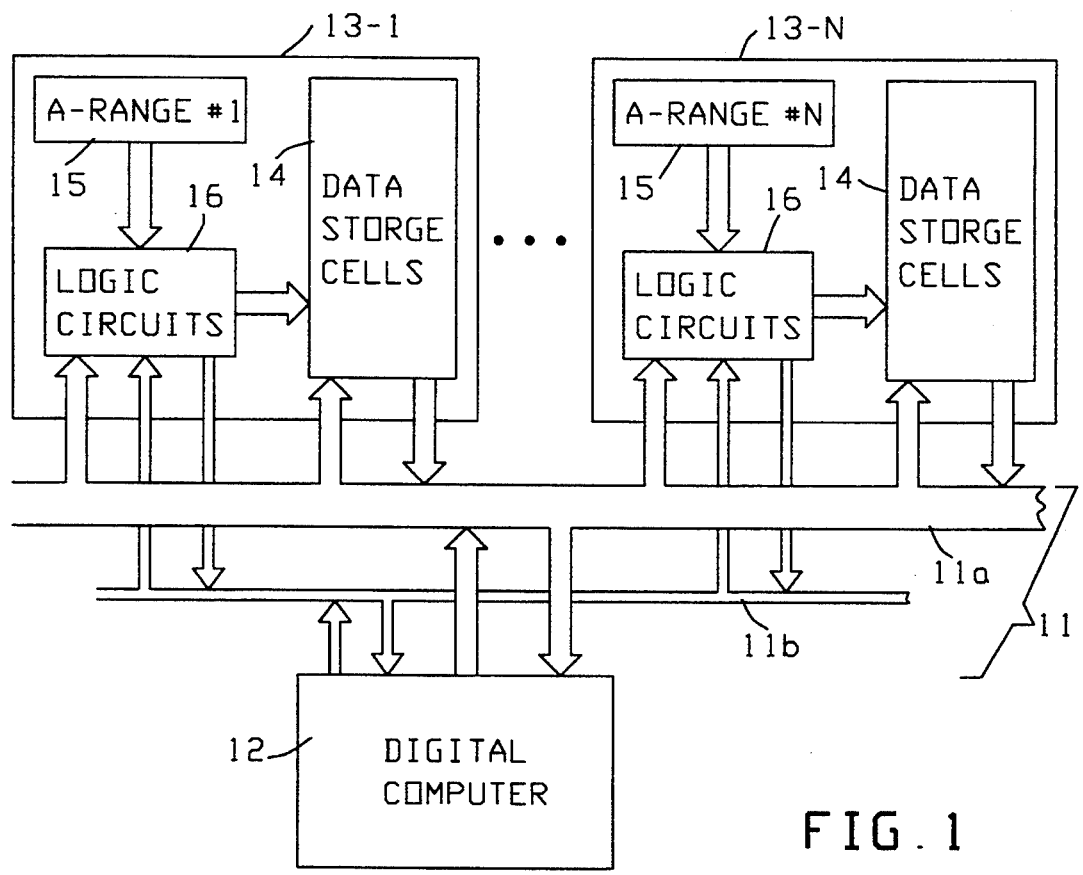
FIG. 1 shows a data processing system that includes several memory modules, each of which is one preferred embodiment of the present invention.

Referring now to FIG. 1, it shows a data processing system 10 which is structured as a preferred embodiment of the present invention. This data processing system includes a system bus 11, a digital computer 12 which is coupled to the system bus 11, and a plurality of memory modules 13-1 thru 13-N which are also coupled to the system bus 11.

Each of the memory modules includes an array 14 of dynamic data storage cells; and, those storage cells are selected in words from the array by an address on the bus 11. Also, each memory module also includes a register 15 which assigns a range of addresses to the memory storage cells on that module. For example, if there are a total of $2^{16}$ data storage cells in the array 14 on each of the modules 13-1 thru 13-N, then module 13-1 will be assigned an address range of 0 thru $2^{16}$-1; module 13-2 will be assigned an address range of $2^{16}$ thru $2(2^{16})$-1; module 13-3 will be assigned an address range of $2(2^{16})$ thru $3(2^{16})$-1; etc.

Further included on each of the memory modules 13-1 thru 13-N is a logic circuit 16 which controls the actual reading and writing of the storage cells 14. In particular, the logic circuit 16 receives an address on the bus 11 from the digital computer 12, and it compares the received address to the range of addresses that are stored in register 15. Then, in the memory module where an address match occurs, the logic circuit 16 performs a read or a write operation on the addressed word of data storage cells.

Suppose now that through an error, two of the memory modules 13-1 and 13-N are assigned the same range of addresses by their register 15. In that case, the memory modules 13-1 and 13-N will operate in parallel such that they perform the same command on the same data in their respective storage cells 14.

For example, when the digital computer 12 sends a memory write command along with a particular address $AD_B$ on the system bus 11 which matches the address range for memory module 13-1, that same address $AD_B$ will also match the address range for memory module 13-N. Thus, both of the modules 13-1 and 13-N will perform the write operation at address $AD_B$ in parallel.

Subsequently, when the digital computer 12 sends the address $AD_B$ along with a read command on the bus 11, a match will again occur in both of the modules 13-1 and 13-N. Thus both of those modules will in parallel send the data that they previously stored at address $AD_B$ onto the system bus.

When the above scenario occurred in the prior art, the digital computer 12 had no way of detecting that two memory modules were writing data into and reading data from their data storage cells 14 in parallel. However, when the control circuit 16 is structured in accordance with the present invention, as shown in FIG. 2, that problem is overcome.

Figure 2:
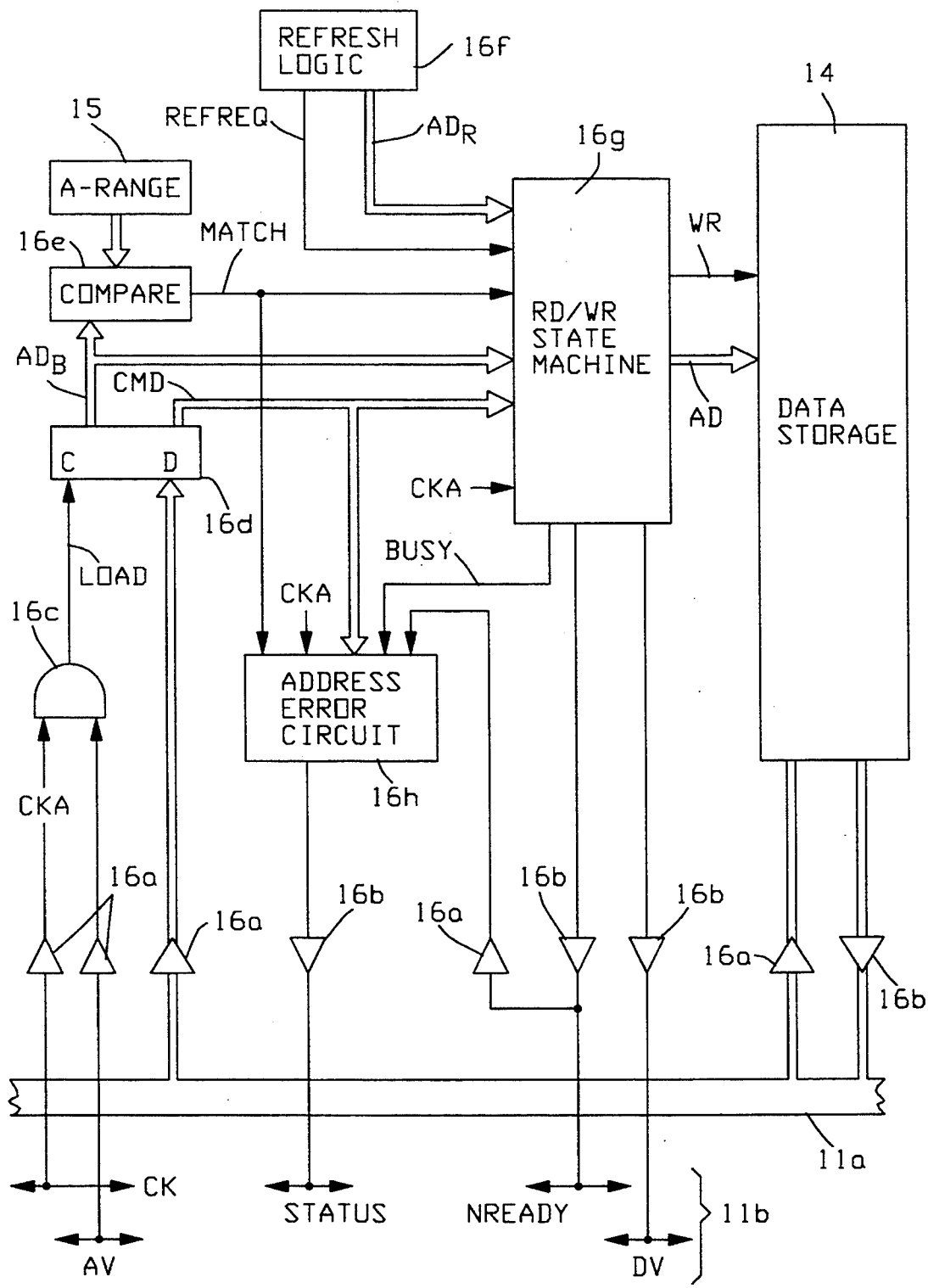
FIG. 2 is a detailed logic diagram of one memory module in the FIG. 1 system.

In FIG. 2, all of the components which make up the control circuit 16 are indicated by reference numerals 16a thru 16h. Each item 16a is a receiver circuit which receives signals from the bus 11; and, each item 16b is a transmitter circuit which transmits signals to the bus 11. Item 16c is an AND gate. Item 16d is a register with a data input D and a clock input C which receives the memory address $AD_B$ and memory command from the bus.

Item 16e is a comparator circuit which generates a MATCH signal when the bus address $AD_B$ falls within the address range that is stored in register 15. Item 16f is a refresh logic circuit which generates a REFREQ signal and an address $AD_R$ when the cells 14 at address $AD_R$ need to be refreshed. This REFREQ signal is generated in each memory module with a low frequency that is out of sync with the other memory modules.

Item 16g is a read/write state machine. It responds to the MATCH signal to perform the command CMD in register 16d on the memory cells 14 at the address $AD_B$. Also, the state machine 16g responds to the REFREQ signal to refresh the data in the cells 14 at address $AD_R$.

Figure 5:
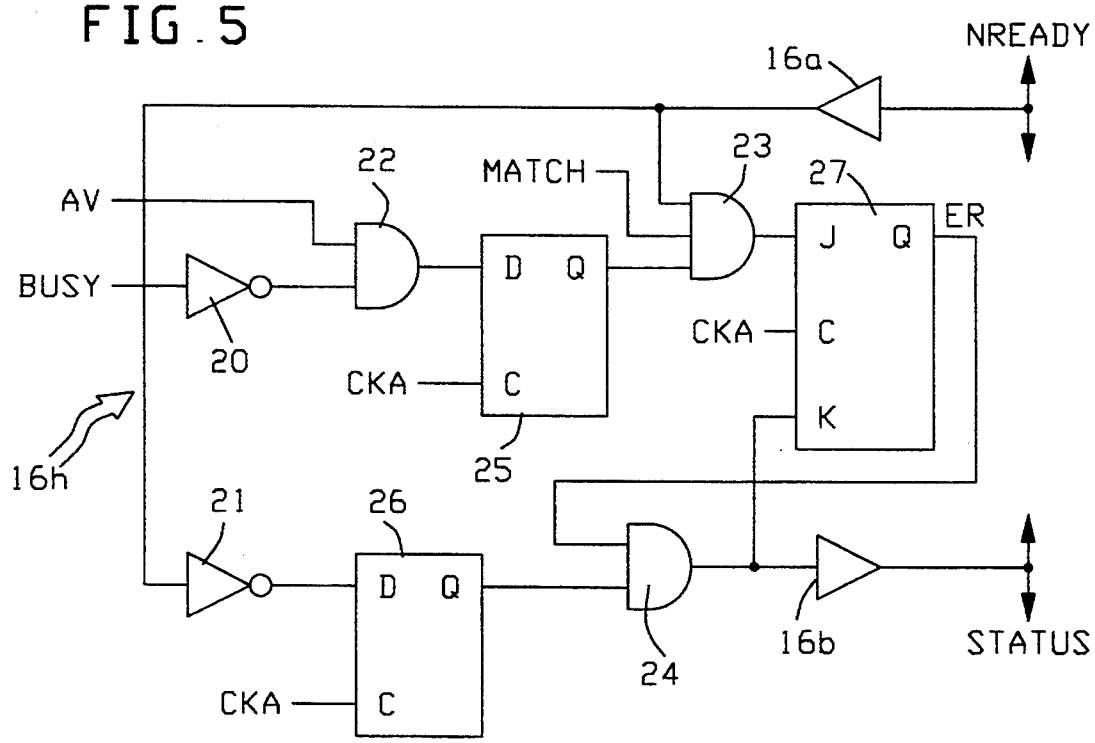

Item 16h is an address error detection circuit as drawn in detail in FIG. 5. All of these components 16a thru 16h are interconnected to each other as well as to the bus 11, the storage cells 14, and the address range register 15 as FIG. 2 shows.

Figure 3:
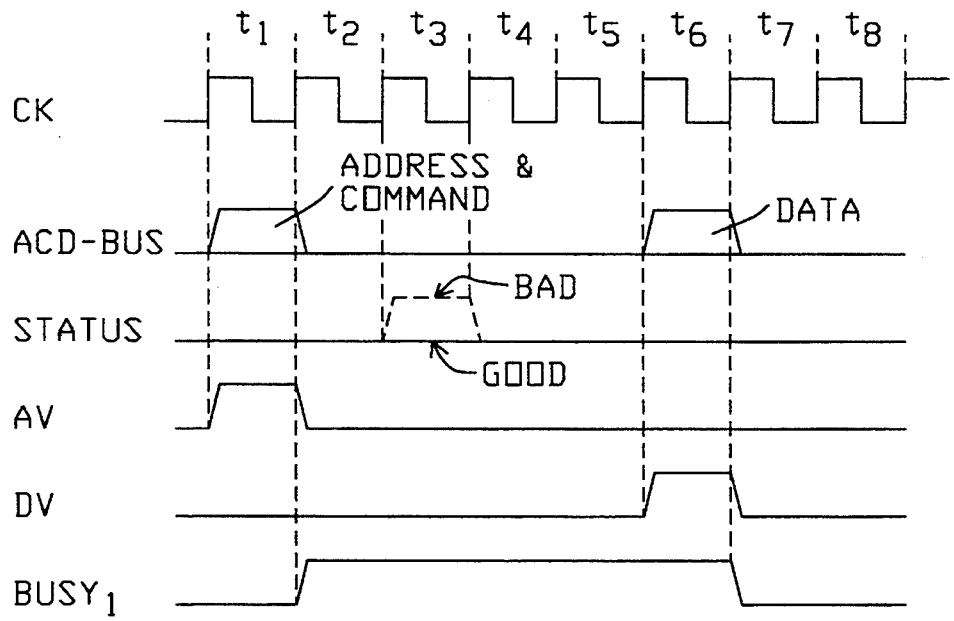
FIG. 3 is a timing diagram which illustrates how the FIG. 2 memory module performs a Read command when each such module in the FIG. 1 system is assigned a different address range.
Figure 4:
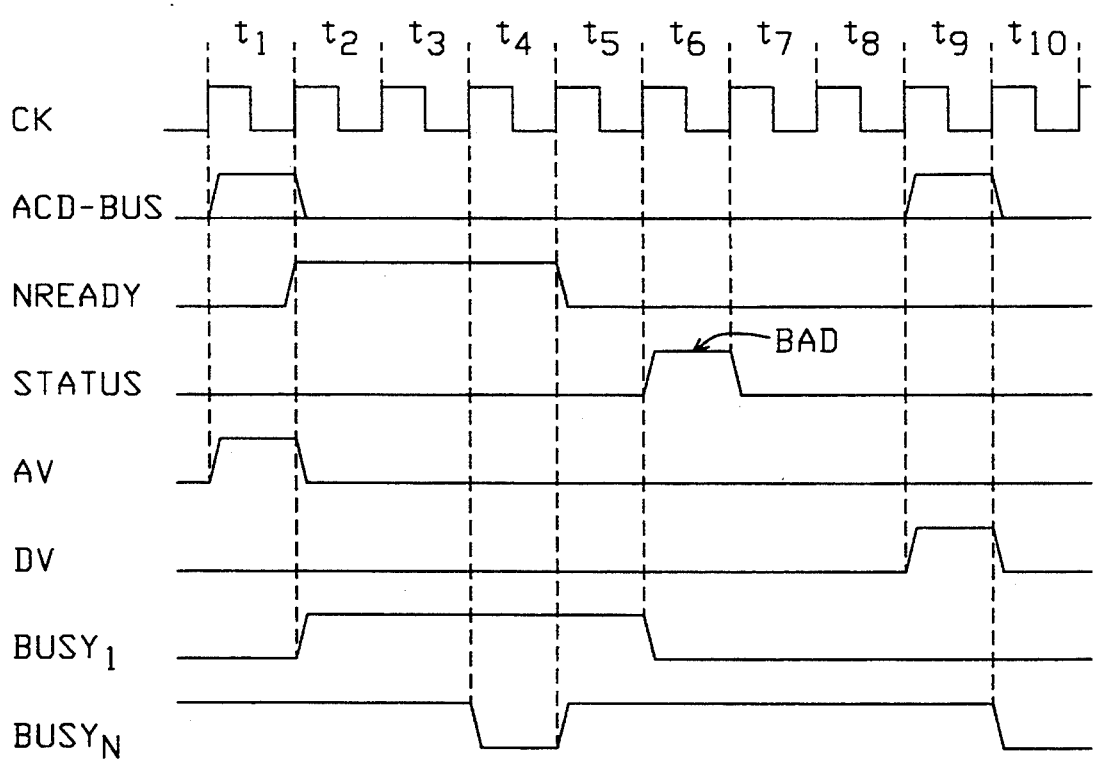
FIG. 4 is a detailed timing diagram which shows how the FIG. 2 memory module performs a Read command and detects an error when two such modules in the FIG. 1 system are assigned the same address range; and, FIG. 5 is a detailed logic diagram of an address error detection circuit in the memory module of FIG. 2.

Two important timing sequences by which the FIG. 2 components operate are illustrated by the signal waveforms of FIGS. 3 and 4. In those figures, the signal ACD-bus shows the memory address, command, and data that occur on one portion of the system bus 11a. The remaining portion 11b of the system bus carries a clock signal CK, an address valid signal AV, a data valid signal DV, a status signal STATUS, and a not ready signal NREADY.

Clock signal CK consists of a series of high frequency clock pulses, each of which defines a certain time period $t_1$, $t_2$, $t_3$, etc. Two other signals which are shown in the FIGS. 3 thru 5 are the $BUSY_1$ and $BUSY_2$ signals, and they are generated internally within the FIG. 2 control circuit by the Read/Write state machine 16g.

During time interval $t_1$ in FIG. 3, the digital computer 12 sends a Read command and memory address on the ACD bus 11a to the memory modules 13-1 thru 13-N. Computer 12 indicates this event on the bus 11 by forcing the address valid AV signal to a true state during time interval t1.

In response to the address valid signal, each memory module stores, at the end of time interval t1, the memory address and the memory command which the digital computer 12 sent on the ACD bus 11a. This storage occurs in register 16d of the FIG. 2 memory module in response to a LOAD signal from the output of AND gate 16c.

Thereafter, during time interval t2, the address that is stored in register 16d is compared via the compare circuit 16e to the address range that is stored in register 15. If the received address falls within the address range, then the compare circuit 16e sends a MATCH signal to the Read/Write state machine 16g which causes the memory module to go busy. In FIG. 3, the signal $BUSY_1$ indicates that a MATCH occurred in the first memory module 13-1.

In the memory module where a MATCH occurs, that module sends a STATUS signal on the bus control lines 11b during the second clock cycle after the AV signal. This status can be either "good" or "bad". If the status is good, then the memory module in which the MATCH occurred continues with the Read operation. This includes sending data from the addressed storage cells onto the bus 11a during the fifth clock cycle after the AV signal.

The sending of the data onto the bus 11a is indicated by the memory module by forcing the data valid DV signal true during time period t6. Then, at the end of time period t6, the Read/Write state machine 16g becomes unbusy and ready to perform another Read or Write operation.

Suppose now that in the above described FIG. 3 Read operation, memory module 13-N was working incorrectly such that it performed a Read in parallel with memory module 13-1. In that case, module 13-N would send the MATCH signal to its Read/Write state machine 16g; it would send "good" status on the bus 11b at clock period t3; and it would send data on the ACD-bus 11a at time period t6. If the data from the memory module 13-N is the same as the data from the memory module 13-1, then the erroneous operation of module 13-N will go undetected by the digital computer 12.

How the present invention solves the above problem is illustrated by the timing diagram of FIG. 4. In FIG. 4, at time period t1, the digital computer 12 again sends a memory address and a read command on the ACD-bus 11a to all of the memory modules. Now, suppose that through an error, this address causes the MATCH signal to be generated in memory modules 13-1 and 13-N. In that case, both of those memory modules will perform the Memory Read Operation.

However, when the digital computer 12 sends the address in FIG. 4, memory module 13b happens to be busy doing a refresh cycle whereas memory module 13-1 is not busy doing anything. This situation will occasionally occur because in each of the memory modules, a refresh cycle starts in response to the REFREQ signal; and the REFREQ signals in all of the modules occur at random with respect to each other.

Since memory module 13-N is busy doing a refresh cycle when the memory address is received at clock t1, that module 13-N responds during clock t2 by sending the NREADY signal on the bus control lines 11b. This NREADY signal informs the digital computer 12 that it will have to wait longer than the normal five clock cycles of FIG. 3 to receive its data.

Also during the clock period t2 of FIG. 4, the address error circuit 16h in the memory module 13-1 monitors the bus 11b for the NREADY signal. If during time period t2, circuit 16h in module 13-1 detects the NREADY signal on the bus 11b and it also detects a MATCH signal from comparator 16e and it further detects that state machine 16g was not busy during the preceding time period t1, then the error circuit 16h generates an error signal ER. A preferred circuit for generating this signal ER is shown in detail in FIG. 5.

After the error is detected by module 13-1 as described above, the error signal ER is not immediately reported over the bus to the computer 12. Instead, circuit 16h in module 13-1 waits until the memory module 13-N completes its refresh operation. When that occurs, the BUSY signal in module 13-N goes false; and as an example, this is shown in FIG. 4 as occurring at time period t4.

In response, at the start of time period t5, module 13-N forces the NREADY signal false on bus 11b. Thereafter, during time period t6, the address error circuit 16h in module 13-1 reports the error ER which it previously detected during time interval t2 as "bad" status on bus 11b.

Upon receiving the bad status report from bus 11b, the digital computer 12 then sends a message to an operator of an I/O terminal (not shown) on the bus advising that corrective action needs to be taken. Meanwhile, during time periods t5 thru t9, memory module 13-N completes the read command which it previously received during time period t1.

Turning now to FIG. 5, it shows the details of a preferred embodiment for the address error circuit 16h. This embodiment includes inverters 20 and 21, AND gates 22-24, D-type triggerable flip-flops 25 and 26, a JK flip-flop 27, a bus receiver 16a, and a bus transmitter 16b. All these components are interconnected as shown.

In operation, flip-flop 25 gets set when the address valid signal AV occurs on the bus 11b and the Read/Write state machine 16g is not busy. In FIG. 4, this condition will be detected by flip-flop 25 at the start of time period t2.

Next, AND gate 23 detects the simultaneous occurrence of flip-flop 25 being set and a MATCH signal from the comparator circuit 16e and a NREADY signal on the bus 11b. If those three signals simultaneously occur at the start of the next clock period, then flip-flop 27 gets set and thereby generates the error signal ER. In FIG. 4, flip-flop 27 gets set at the start of clock period t3.

After an error is detected by flip-flop 27, that flip-flop remains set until the error gets reported as status on the bus 11b. To report the error status, flip-flop 26 must get set; and that occurs after the NREADY signal on bus 11a goes false. In FIG. 4, flip-flop 26 gets reset at the start of time period t6. Then, during time period t6, the error ER gets reported on the bus 11b through AND gate 24 and transmitter 16b; and, at the start of the next time period t7, the error flip-flop 27 gets reset.

One preferred embodiment of the invention has now been described in detail. In addition however, many changes and modifications can be made to the details of this embodiment without departing from the nature and spirit of the invention.

For example, the data storage cells 14 need not be dynamic RAM data storage cells. As an alternative, the data storage cells 14 can be static storage cells. Also, the static or dynamic storage cells can be Read/Write cells, or Read Only cells.

If the storage cells 14 are static cells, then the refresh logic circuit 16f of FIG. 2 should be modified to generate the REFREQ signal but not generate the refresh address $AD_R$. Then, the Read/Write state machine 16g will respond to the REFREQ signal exactly as previously described in conjunction with FIG. 4 with the exception that no refresh operation is actually performed on the data storage cells 14.

Thus with the above modification, the Read/Write state machine 16g will respond to the REFREQ signal by setting the BUSY signal as shown at time periods t1-t3 in FIG. 4. Then, if an address $AD_B$ and a Read command is received from the bus while the BUSY signal is true and a MATCH occurs, the state machine 16g will generate the NREADY signal just as is shown at time periods t2-t4 in FIG. 4.

Later, the state machine 16g will perform the Read command as shown at time periods t5-t9 of FIG. 4. Thus, by the modified circuit 16f, the Read command and address $AD_B$ from the bus which causes a MATCH signal would at times be executed with a long time interval during which an address error would be detected as previously described in conjunction with FIG. 5.

Preferably, the REFREQ signal is generated with a frequency that is much lower than the frequency of the clock signal CK so that almost always a Read command from the bus is performed during the short time interval $t_1$-$t_6$ of FIG. 4. Thus, the occasional long time interval $t_1$-$t_{10}$ of FIG. 5 in which a bus Read command is executed does not degrade overall system performance. Suitably, the frequency of signal REFREQ is at least one-thousand times less than the clock signal frequency.

Also, as another alternative, the range of addresses which causes a MATCH signal in each of the memory modules can be stored in various circuits other than the register 15 as shown in FIGS. 1 and 2. For example, that register 15 can be replaced with a set of electromechanical switches which are opened or closed in various combinations to specify the address range.

Further, the present invention is not limited to detecting addressing errors which are caused by an erroneous setting of the address range in register 15 or a set of address switches. Instead, the address error which the present invention detects can be due to any circuit defect which causes the MATCH signal to be generated in two memory modules in response to the same bus address $AD_B$. Such a circuit defect can occur, for example, in the FIG. 2 compare circuit 16e or the FIG. 2 register 16d.

Further, as still another modification, the NREADY signal that is sent on the bus from one memory module to another and utilized to detect the error ER can be given any name. In essence, the NREADY signal can be replaced by any control signal on the bus which is transmitted and received by all of the memory modules and which indicates when one of the memory modules has selected a long time interval for executing a Read command from the bus.

Further, as still another modification, each of the memory modules 13-1 thru 13-N may be physically packaged in a variety of structures. For example, each module may be physically packaged on a single printed circuit board. Alternatively, each module may be physically packaged as multiple integrated circuit chips on a single ceramic substrate having a thin film of patterned conductors that interconnect the chips.

As another modification, the FIG. 1 data processing system can be expanded to include a second digital computer on a second bus which connects to all of the memory modules 13-1 thru 13-N in parallel with the illustrated bus 11. In that case, the FIG. 2 components 16a, 16c, 16d, and 16e would be duplicated to generate a second MATCH signal, CMD signal, and address signal $AD_B$ from the second bus; the state machine 16g would be expanded to receive the above signals; and, the busy signal would be generated by the state machine 16g whenever it is performing a refresh cycle or a command from either bus.

Further, the present invention can also be used to detect addressing errors in non-memory modules that are intercoupled by a bus and which are selectively addressed. Suppose, for example, that each of the modules 13-1 thru 13-N in the FIG. 1 system is replaced with a sensor module which samples an external analog signal and sends the digital value of the sample to the computer 12 upon receipt of a Read command and device address $AD_B$ from the computer. If each sensor module has the same response time on the bus to the Read command, then any two modules would send their samples in parallel on the bus when, through an error, those two modules generate a MATCH signal in response to the same device address $AD_B$. However, this problem is overcome, with the FIG. 2 circuit when the data storage cells 14 are replaced with the external analog sensor circuit, sampler circuit, and A/D converter circuit. Then, the state machine 16g will usually send the samples onto the bus 11 with the short time interval of FIG. 3; and occasionally it will send the samples with the long time interval of FIG. 4. During the long time interval, an address error ER of two modules responding to the same address will be detected by the FIG. 5 circuit as previously described.

Accordingly, it is to be understood that the invention is not limited to the illustrated preferred embodiment but is defined by the appended claims.

What is claimed is:

1. A memory module, for use in multiples on a bus as a memory system; said memory module comprising a plurality of storage cells that are assigned a range of addresses, an input circuit for receiving a read command and a read address from said bus, and a compare circuit which generates a match signal when said read address is within said assigned address range for said storage cells; wherein said module further includes:

a control circuit, coupled to said compare circuit, which responds to said match signal by occasionally executing said read command in a long tame interval on said bus and at all other times executing said read command in a small time interval;

a bus transmit circuit, coupled to said control circuit, for sending a control signal on said bus if said control circuit selects said long time interval; and, an error circuit, coupled to said control circuit and said bus, for setting an error flag if said control circuit selects said small time interval and, during that small time interval, said control signal is detected on said bus from another memory module which selects said long time interval in said memory system;

whereby an error is detected when two memory modules generate said match signal for a single read command and one memory module executes that read command in said small time interval, while the other memory module executes that read command in said long time interval.

2. A memory module according to claim 1 wherein said storage cells are dynamic storage cells.

3. A memory module according to claim 2 wherein said control circuit performs at least a portion of a refresh operation on said dynamic storage cells when said long time interval is selected.

4. A memory module according to claim 3 wherein said control circuit performs said refresh operation intermittently and selects said long time interval when said match signal occurs while said refresh operation is being performed.

5. A memory module according to claim 4 wherein said error circuit sets said error flag if said control signal is detected on said bus at a predetermined time instant from the start of said small time interval.

6. A memory module according to claim 1 wherein said storage cells are static storage cells.

7. A memory module according to claim 1 wherein said storage cells are read-write storage cells.

8. A memory module according to claim 1 wherein said storage cells are read-only storage cells.

9. A memory module according to claim 1 wherein said selectable address range for said storage cells is electrically stored in a register on said module.

10. A memory module according to claim 1 wherein said selectable address range for said storage cells is mechanically stored in switches on said module.

11. A memory module according to claim 1 wherein the entire module is packaged on a single printed circuit board.

12. A module, for use in multiples on a bus in a data processing system, said module comprising a circuit which assigns said module an address, an input circuit for receiving a read command and an address from said bus, and a compare circuit which generates a match signal when said received address matches said assigned address; wherein said module further includes:

a control circuit, coupled to said compare circuit, which responds to said match signal by occasionally executing said read command in a long time interval on said bus and at all other times executing said read command in a sell time interval;

a bus transmit circuit, coupled to Said control circuit, for sending a control signal on said bus if said control circuit selects said long time interval; and, an error circuit, coupled to said control circuit and said bus, for setting an error flag it said control circuit selects said small time interval and, during that small time interval, said control signal is detected on said bus from another module which selects said long time interval in said system;

whereby an error is detected when two modules generate said match signal for a signal read command and one module executes the read command in said small time interval, while the other module executes that read command in said long time interval.

* * * * *